United States Patent
Chen et al.

(10) Patent No.: US 9,685,402 B2
(45) Date of Patent: *Jun. 20, 2017

(54) SEMICONDUCTOR DEVICE AND METHOD OF FORMING RECESSES IN CONDUCTIVE LAYER TO DETECT CONTINUITY FOR INTERCONNECT BETWEEN SEMICONDUCTOR DIE AND SUBSTRATE

(75) Inventors: Jen Yu Chen, Hsinchu (TW); Chien Chen Lee, Hsinchu County (TW); Yi Wen Huang, Taipei (TW); Ke Jung Jen, Kaohsiung (TW)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/324,397

(22) Filed: Dec. 13, 2011

(65) Prior Publication Data

US 2013/0147035 A1    Jun. 13, 2013

(51) Int. Cl.
| | |
|---|---|
| *H01L 23/498* | (2006.01) |
| *H01L 23/00* | (2006.01) |
| *H01L 21/66* | (2006.01) |
| *H05K 1/02* | (2006.01) |
| *H05K 3/34* | (2006.01) |

(52) U.S. Cl.
CPC ........ *H01L 23/49838* (2013.01); *H01L 22/12* (2013.01); *H01L 24/14* (2013.01); *H01L 2224/16225* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H05K 1/0269* (2013.01); *H05K 3/3436* (2013.01)

(58) Field of Classification Search
CPC . H01L 23/12; H01L 23/49838; H05K 3/3436; H05K 1/0269
See application file for complete search history.

(56) References Cited

U.S. PATENT DOCUMENTS

| | | |
|---|---|---|
| 5,012,502 A | 4/1991 | Battin et al. |
| 5,184,768 A | 2/1993 | Hall et al. |

(Continued)

*Primary Examiner* — Thao X Le
*Assistant Examiner* — Gardner W Swan
(74) *Attorney, Agent, or Firm* — Robert D. Atkins; Patent Law Group: Atkins and Associates, P.C.

(57) ABSTRACT

A semiconductor device has a semiconductor die with composite bump structures over a surface of the semiconductor die. A conductive layer is formed over the substrate. The conductive layer has a channel in an interconnect site of the conductive layer. The channel extends beyond a footprint of the composite bump structures. The semiconductor die is disposed over the substrate. The bump material of the composite bump structures is melted. The composite bump structures are pressed over the interconnect site of the conductive layer so that the melted bump material flows into the channel. Electrical continuity between the composite bump structures and conductive layer is detected by a presence of the bump material in the channel. No electrical continuity between the composite bump structures and conductive layer is detected by an absence of the bump material in the channel. The electrical continuity can be detected by visual inspection or X-ray.

24 Claims, 9 Drawing Sheets

(56) References Cited

U.S. PATENT DOCUMENTS

| | | | |
|---|---|---|---|
| 5,489,750 A * | 2/1996 | Sakemi | H01L 24/81 174/260 |
| 5,828,128 A | 10/1998 | Higashiguchi et al. | |
| 6,324,754 B1 * | 12/2001 | DiStefano | H01L 23/49838 228/180.22 |
| 6,573,610 B1 * | 6/2003 | Tsai | H01L 23/49838 257/778 |
| 6,608,388 B2 | 8/2003 | Lin et al. | |
| 6,678,948 B1 * | 1/2004 | Benzler | H01L 24/81 228/103 |
| 7,271,482 B2 * | 9/2007 | Kirby | 257/736 |
| 8,482,291 B2 * | 7/2013 | Itoh | H01L 22/34 257/737 |
| 8,604,625 B1 * | 12/2013 | Kim | H01L 24/13 228/180.22 |
| 8,741,764 B2 * | 6/2014 | Chen | H01L 22/12 257/E21.508 |
| 2001/0015285 A1 * | 8/2001 | Nakayama | H01L 23/49816 174/250 |
| 2002/0125043 A1 * | 9/2002 | Yoshida | H01L 22/34 174/261 |
| 2002/0158110 A1 * | 10/2002 | Caletka | B23K 3/0623 228/180.22 |
| 2003/0205817 A1 * | 11/2003 | Romankiw | H01L 21/7682 257/758 |
| 2007/0126126 A1 | 6/2007 | Kim et al. | |
| 2010/0078784 A1 * | 4/2010 | Otremba | 257/676 |
| 2011/0316154 A1 * | 12/2011 | Matsumoto | 257/737 |
| 2013/0127042 A1 | 5/2013 | Lee et al. | |

* cited by examiner

SEMICONDUCTOR DEVICE AND METHOD OF FORMING RECESSES IN CONDUCTIVE LAYER TO DETECT CONTINUITY FOR INTERCONNECT BETWEEN SEMICONDUCTOR DIE AND SUBSTRATE

FIELD OF THE INVENTION

The present invention relates in general to semiconductor devices and, more particularly, to a semiconductor device and method of forming a recess in a conductive layer to detect continuity for an electrical interconnect between a semiconductor die and substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions, such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor die has a plurality of bumps formed on the active surface of the die. A substrate has a plurality of conductive traces or contact pads formed on a surface of the substrate. The semiconductor die is mounted to the substrate and the bumps are electrically and metallurgically connected to the conductive traces. In some cases, less than all of the bumps on the semiconductor die make good electrical contact to the conductive traces on the substrate. Any electrical interconnect failure between the bumps on the semiconductor die and conductive traces on the substrate should be detected during manufacturing. In some cases, present visual inspection and X-ray inspection have difficulty detecting electrical interconnect failures between the bumps and conductive traces.

SUMMARY OF THE INVENTION

A need exists to detect an electrical interconnect failure between the bumps on the semiconductor die and conductive traces on the substrate. Accordingly, in one embodiment, the present invention is a method of making a semiconductor device comprising the steps of providing a flip-chip semiconductor die including a first bump which comprises a first conductive pillar and a first conductive cap formed on a surface of the flip-chip semiconductor die, providing a substrate, forming an insulating layer over the substrate, forming a first conductive trace over the insulating layer, where a length of the first conductive trace is greater than a width of the first conductive trace and the first conductive trace includes a first open channel formed within an interior region of the first conductive trace and extending along the length of the first conductive trace and further extending in-depth to the insulating layer, bonding the flip-chip semiconductor die to the substrate by bringing the first conductive cap in contact with the first conductive trace and reflowing the first conductive cap, where a portion of the first conductive cap flows into the first open channel, and detecting electrical continuity between the first bump and the first conductive trace by a detectable presence of the portion of the first conductive cap in the first open channel.

In another embodiment, the present invention is a method of making a semiconductor device comprising the steps of providing a semiconductor die including a first bump formed on a surface of the semiconductor die, providing a substrate, forming a first conductive trace over the substrate, where a length of the first conductive trace is greater than a width of the first conductive trace and the first conductive trace includes a first open channel formed within an interior region of the first conductive trace and extending along the length of the first conductive trace, disposing the semiconductor die in contact with the substrate and the first bump aligned with the first conductive trace over the first open channel, reflowing the first bump, where the first bump fails to flow into the first open channel, and detecting no electrical continuity between the first bump and the first conductive trace by a detectable absence of a portion of the first bump in the first open channel.

In another embodiment, the present invention is a method of making a semiconductor device comprising the steps of providing a semiconductor die including a first interconnect structure formed on a surface of the semiconductor die, providing a substrate, forming a first conductive trace over the substrate, where the first conductive trace includes a first open channel formed within an interior region of the first conductive trace, disposing the semiconductor die in contact with the substrate and the first interconnect structure aligned with the first conductive trace over the first open channel, reflowing the first interconnect structure, where the first interconnect structure fails to flow into the first open channel, and detecting no electrical continuity between the first interconnect structure and the first conductive trace by a detectable absence of a portion of the first interconnect structure in the first open channel.

In another embodiment, the present invention is a semiconductor device comprising a substrate and a semiconductor die including a first interconnect structure formed on a surface of the semiconductor die. A first conductive trace is formed over the substrate. The first conductive trace includes a first open channel formed within an interior region of the first conductive trace. The semiconductor die contacts the substrate and the first interconnect structure is aligned with the first conductive trace over the first open channel, and the first open channel is devoid of a portion of the first interconnect structure to indicate no electrical continuity between the first interconnect structure and the first conductive trace.

DETAILED DESCRIPTION OF THE DRAWINGS

Figure 1:
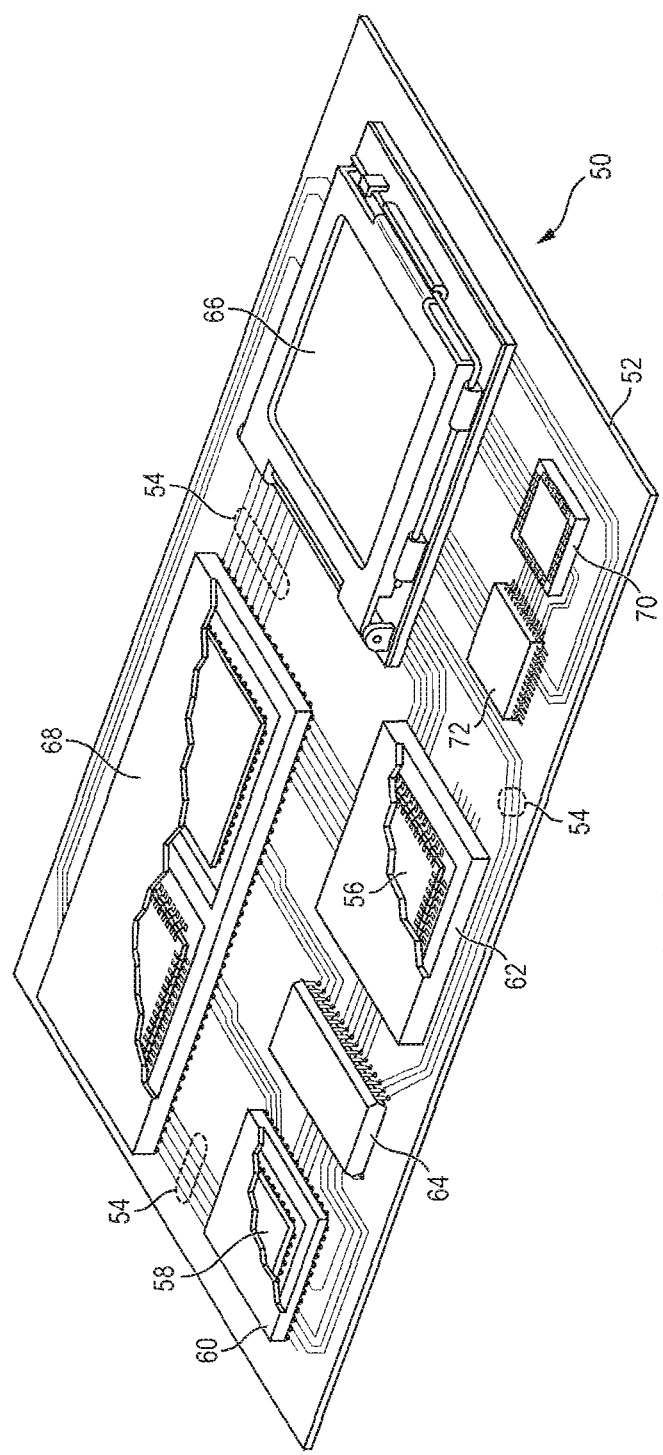
FIG. 1 illustrates a printed circuit board with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
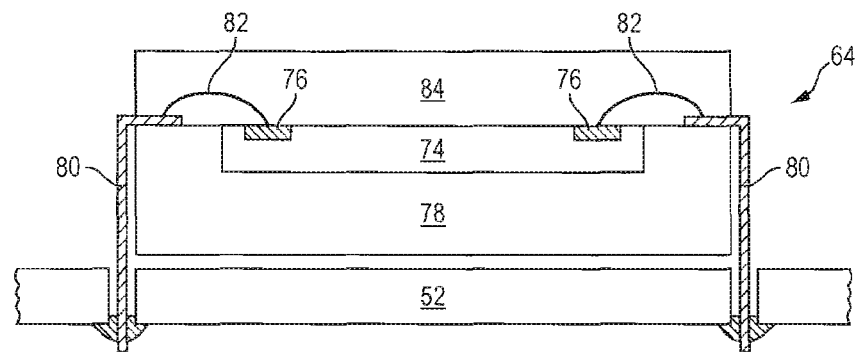
FIGS. 2a-2c illustrate further detail of the representative semiconductor packages mounted to the printed circuit board.
Figure 2B:
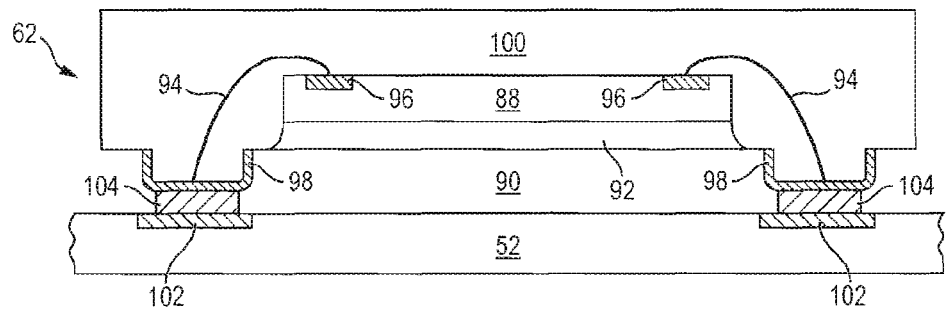
Figure 2C:
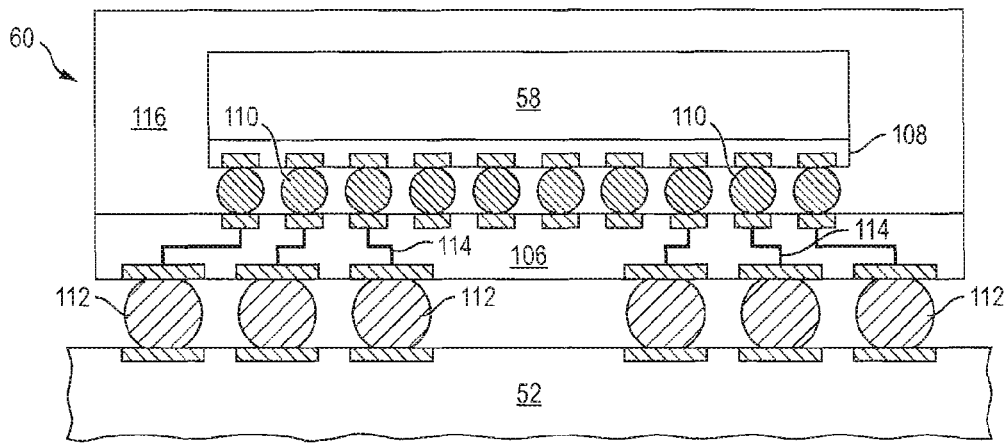

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
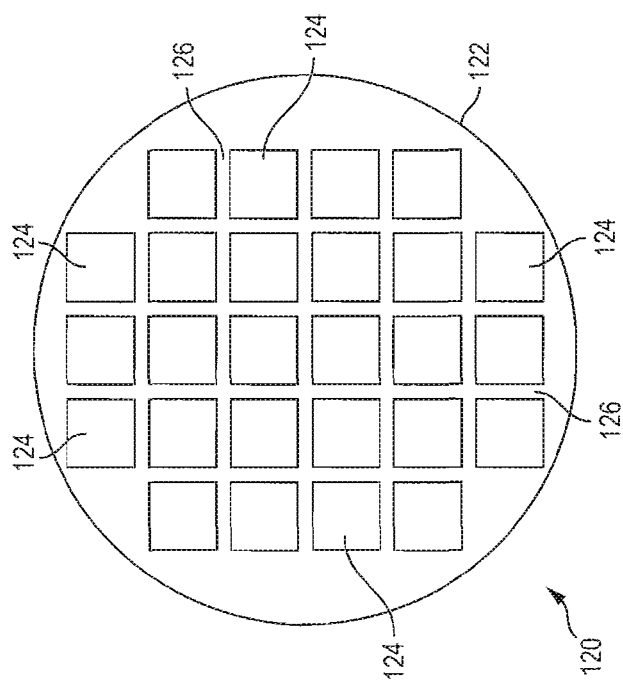
FIGS. 3a-3h illustrate a semiconductor wafer with a plurality of semiconductor die having composite bump structures.

FIGS. 3a-3h illustrate, in relation to FIGS. 1 and 2a-2c, a process of forming a semiconductor wafer with a plurality of semiconductor die having composite bump structures. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
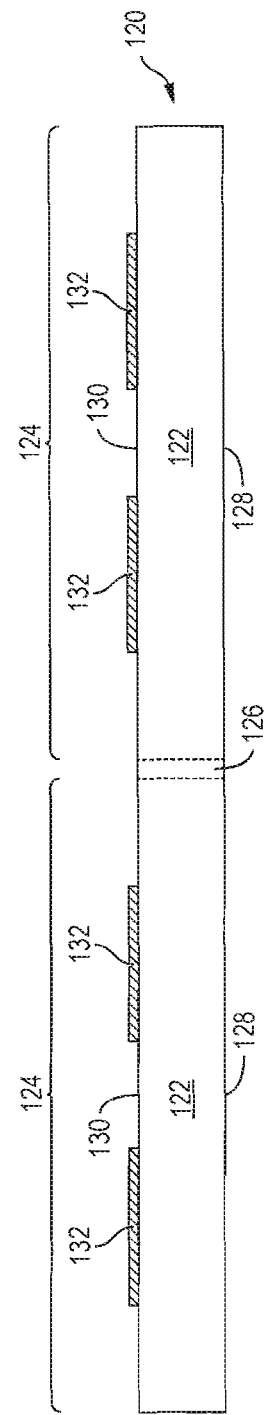

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
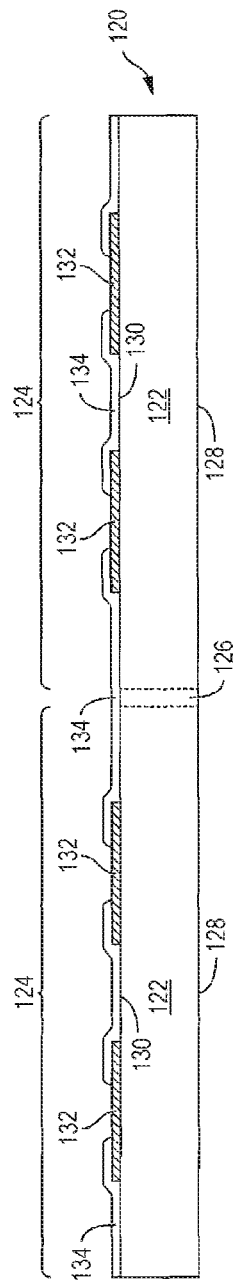

In FIG. 3c, an insulating or passivation layer 134 is conformally applied over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 134 follows a contour of active surface 130 and conductive layer 132. A portion of insulating layer 134 is removed by an etching process through a photoresist layer (not shown) to expose conductive layer 132. A portion of conductive layer 132 remains covered by insulating layer 134.

Figure 3D:
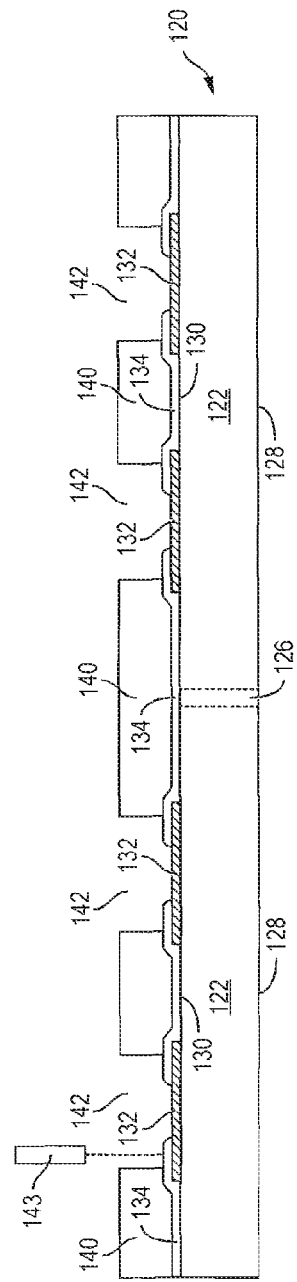

In FIG. 3d, a patterning or photoresist layer 140 is formed over insulating layer 134 and conductive layer 132 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. A portion of photoresist layer 140 is removed by an etching process through a patterned photoresist layer to form patterned openings 142 and expose insulating layer 134 and conductive layer 132. Alternatively, a portion of patterning layer 140 is removed by laser direct ablation (LDA) using laser 143 to form patterned openings 142 and expose insulating layer 134 and conductive layer 132. In one embodiment, patterned openings 142 have a circular cross-sectional area configured to form conductive pillars with a cylindrical shape including a circular cross-section. In another embodiment, patterned openings 142 have a rectangular cross-sectional area configured to form conductive pillars with a cubic shape including a rectangular cross-section.

Figure 3E:
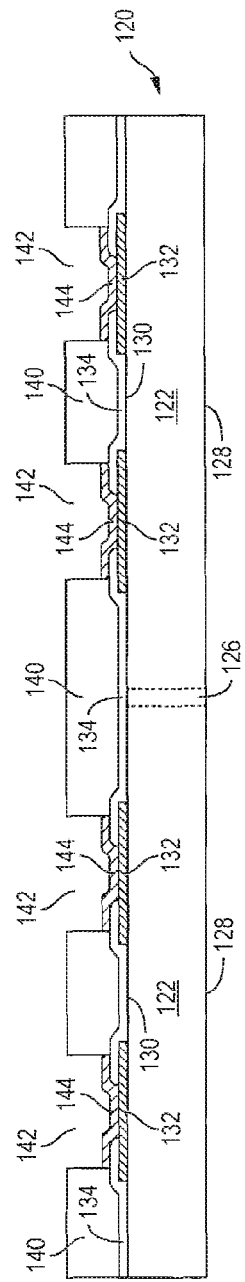

In FIG. 3e, an electrically conductive layer 144 is conformally applied over insulating layer 134 and conductive layer 132, within openings 142, using a patterning and metal deposition process such as printing, PVD, CVD, sputtering, electrolytic plating, and electroless plating. Alternatively, conductive layer 144 can be formed over insulating layer 134 and conductive layer 132 prior to forming photoresist layer 140. Conductive layer 144 can be one or more layers of Al, Cu, Sn, Ti, Ni, Au, Ag, or other suitable electrically conductive material. In one embodiment, conductive layer 144 is a multi-layer stack including a seed layer, barrier layer, and adhesion layer. The seed layer can be titanium copper (TiCu), titanium tungsten copper (TiWCu), or tantalum nitrogen copper (TaNCu). The barrier layer can be Ni, nickel vanadium (NiV), platinum (Pt), palladium (Pd), TiW, or CrCu, or other suitable material. The adhesion layer can be Ti, TiN, TiW, Al, or chromium (Cr), or other suitable material. Conductive layer 144 follows the contour of insulating layer 134 and conductive layer 132. Conductive layer 144 is electrically connected to conductive layer 132.

Figure 3F:
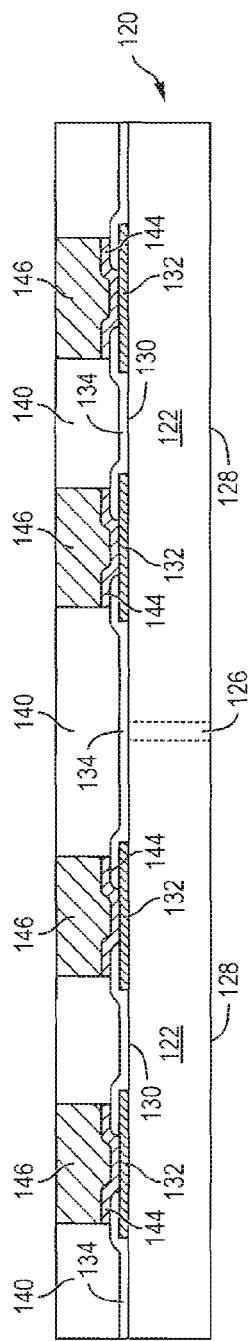

In FIG. 3f, an electrically conductive material 146 is deposited within openings 142 and over conductive layer 144 using an evaporation, sputtering, electrolytic plating, electroless plating, or screen printing process. Conductive material 146 can be Cu, Al, tungsten (W), Au, solder, or other suitable electrically conductive material. In one embodiment, conductive material 146 is deposited by plating Cu in the patterned openings 142 of photoresist layer 140.

Figure 3G:
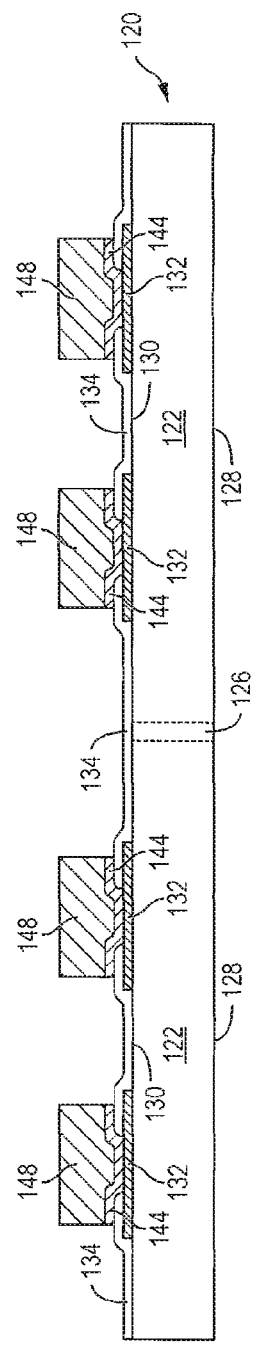

In FIG. 3g, photoresist layer 140 is removed by an etching process to leave individual conductive pillars 148 having a height ranging from 2-120 micrometers (μm). Conductive pillars 148 can have a cylindrical shape with a circular or oval cross-section, or conductive pillars 148 can have a cubic shape with a rectangular cross-section. In another embodiment, conductive pillars 148 can be implemented with stacked bumps or stud bumps.

Figure 3H:
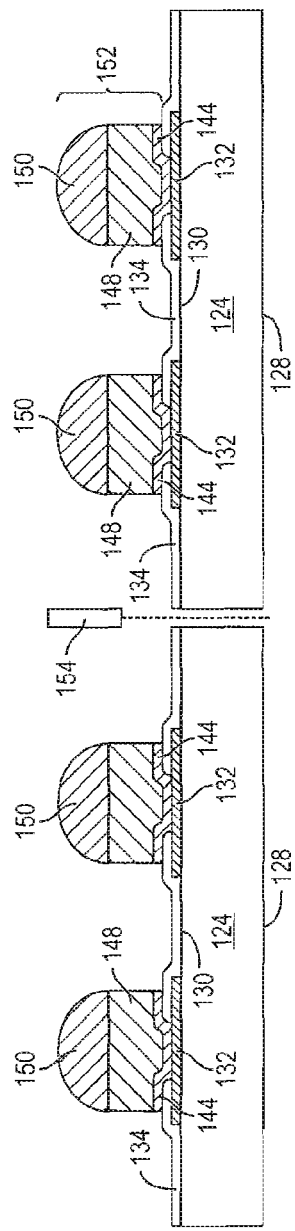

In FIG. 3h, an electrically conductive bump material is deposited over conductive pillars 148 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded bump cap 150. The combination of conductive pillars 148 and bump cap 150 constitute a composite interconnect 152 with a non-fusible portion (conductive pillar 148) and fusible portion (bump cap 150).

Semiconductor wafer 120 is singulated through insulating layer 134 and saw street 126 with saw blade or laser cutting tool 154 into individual semiconductor die 124 with composite interconnect structures 152.

Figure 4A:
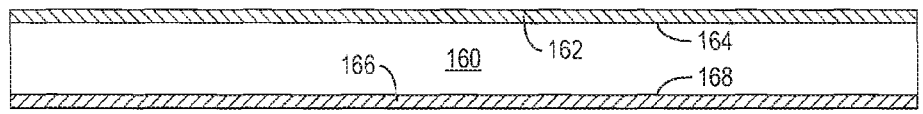
FIGS. 4a-4i illustrate a process of forming a channel in a conductive layer to detect continuity for an electrical interconnect between a semiconductor die and substrate.

FIGS. 4a-4i illustrate, in relation to FIGS. 1 and 2a-2c, a process of forming a channel in a conductive layer to detect continuity for an electrical interconnect between a semiconductor die and substrate. FIG. 4a shows a substrate or PCB 160 suitable for mounting semiconductor die 124. An electrically conductive layer 162 is formed over surface 164 of substrate 160. An electrically conductive layer 166 is formed over surface 168 of substrate 160. Conductive layers 162 and 166 are formed using a patterning and metal deposition process such as printing, PVD, CVD, sputtering, electrolytic plating, and electroless plating. Conductive layers 162 and 166 can be one or more layers of Al, Cu, Sn, Ti, Ni, Au, Ag, or other suitable electrically conductive material.

Figure 4B:
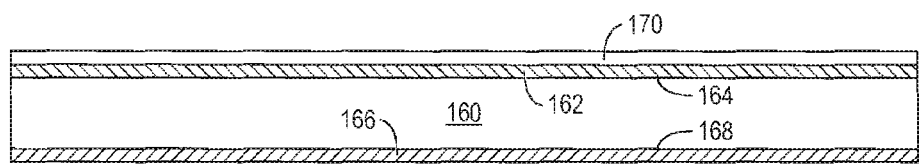

In FIG. 4b, an insulating layer 170 is formed over conductive layer 162. The insulating layer 170 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. The layout of conductive layers 162 and 166 and insulating layers 170 typically uses silk screen printing, photoengraving, PCB milling, electroless plating, or electroplating process.

Figure 4C:
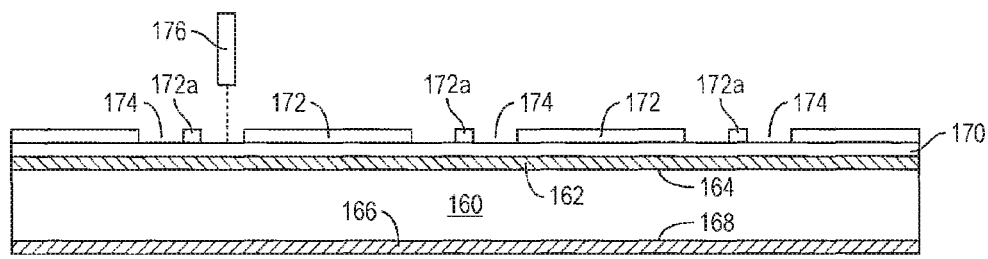

In FIG. 4c, a patterning or photoresist layer 172 is formed over insulating layer 170 using printing, spin coating, or spray coating. In one embodiment, patterning layer 172 is a dry film photoresist lamination with a thickness of 10-60 micrometers (μm). In other embodiments that utilize an insulating layer for patterning, the insulating layer can include one or more layers of SiO2, Si3N4, SiON, Ta2O5, Al2O3, or other material having similar structural properties.

Figure 4D:
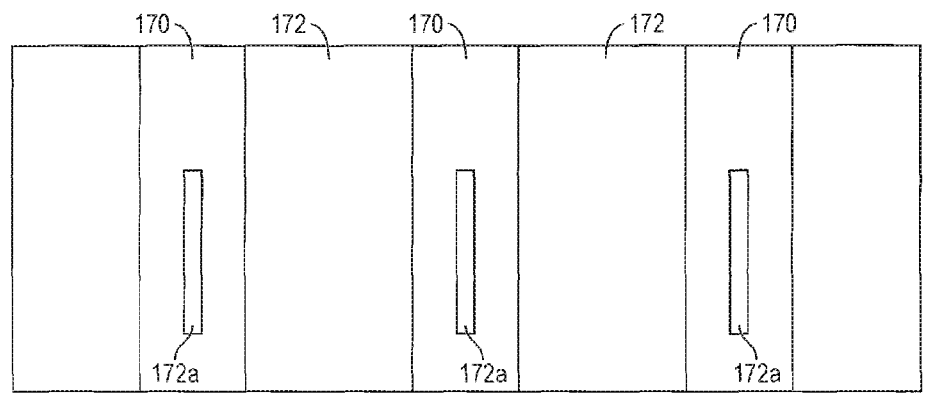
Figure 4E:
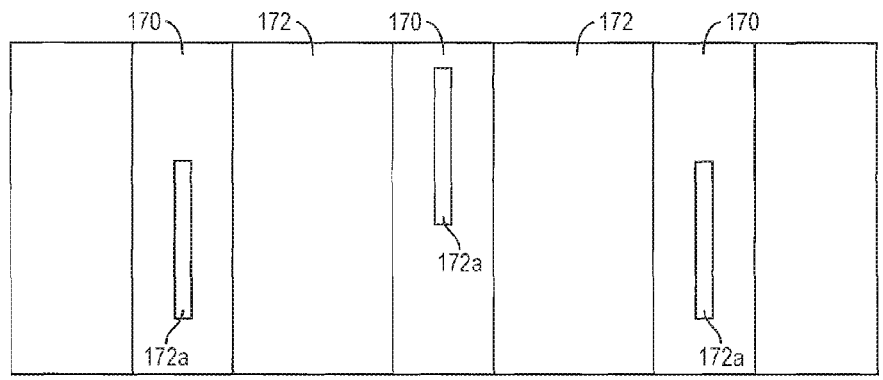

A masking layer is disposed over patterning layer 172. Patterning layer 172 is exposed to ultraviolet (UV) light. The portion of patterning layer 172 outside the masking layer is completely cured by the UV light. The portion of patterning layer 172 beneath the masking layer is not cured by the UV light. The masking layer is removed and patterning layer 172 is subjected to an etching process to form openings 174 over insulating layer 170. Alternatively, openings 174 are formed by laser direct ablation (LDA) using laser 176. The openings 174 coincide with the interconnect or bonding sites designated for composite interconnect structures 152. In particular, openings 174 leave a central region 172a of patterning layer 172. FIG. 4d shows a plan view of openings 174 with side-by-side central regions 172a formed in patterning layer 172. FIG. 4e shows an alternate embodiment of openings 174 with offset central regions 172a formed in patterning layer 172. In one embodiment, central region 172a has a length greater than a width of bump cap 150.

Figure 4F:
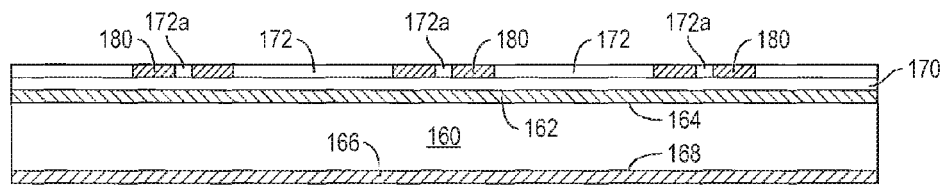

In FIG. 4f, an electrically conductive layer 180 is formed within openings 174 around central regions 172a of patterning layer 172 using an evaporation, sputtering, electrolytic plating, electroless plating, or screen printing process. Conductive layer 180 can be Cu, Al, tungsten (W), Au, solder, or other suitable electrically conductive material. In one embodiment, conductive layer 180 is formed by plating Cu in the patterned openings 174 around central regions 172a of patterning layer 170.

Figure 4G:
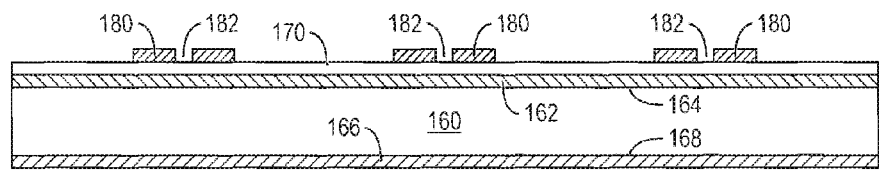

In FIG. 4g, patterning layer 172 is removed by an etching and rinsing process leaving conductive layer 180 with channels or notches 182 formed over insulating layer 170 in the space previously occupied by central regions 172a of patterning layer 172. Channels 182 coincide with a central portion of the interconnect or bonding sites 184 of conductive layer 180 designated for composite interconnect structures 152. Channels 182 extend on both sides beyond a footprint of composite interconnect structures 152. Alternatively, channels 182 extend on at least side beyond a footprint of composite interconnect structures 152. In one embodiment, channels 182 have a length greater than a width of bump cap 150. Conductive layer 180 has a width of 10-40 µm. In one embodiment, conductive layer 180 has a width of 40 µm and a thickness of 30 µm. The width of channel 182 is 10 µm leaving 15 µm of conductive layer 180 on either side of the channel. In fine pitch applications, conductive layer 180 has a width of 1-3 µm.

Figure 4H:
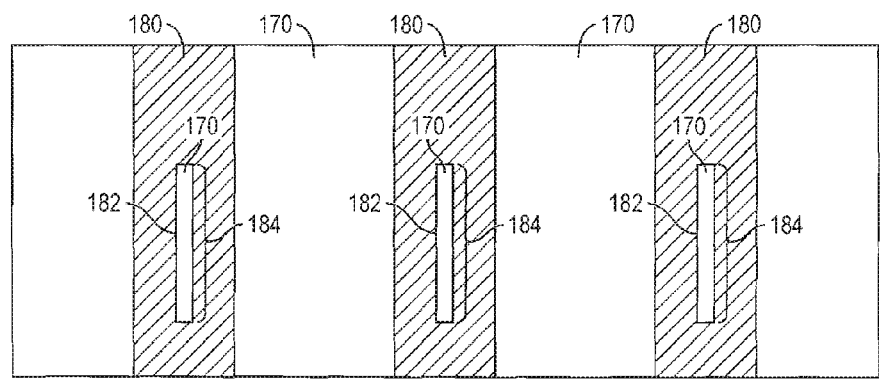
Figure 4I:
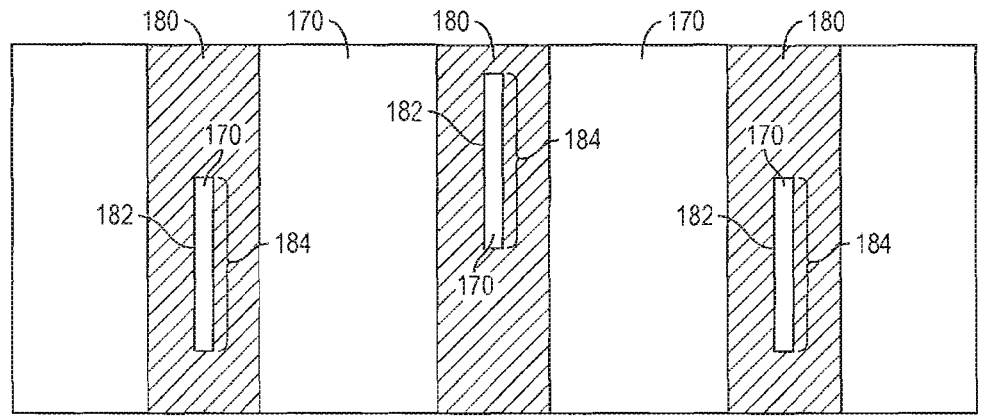

FIG. 4h shows a plan view of conductive layer 180 with side-by-side channels 182 formed over insulating layer 170. FIG. 4i shows a plan view of conductive layer 180 with offset channels 182 formed over insulating layer 170. Channels 182 coincide with the interconnect or bonding sites 184 of conductive layer 180 designated for composite interconnect structures 152. An optional flux material is deposited over interconnect sites 184.

Figure 5A:
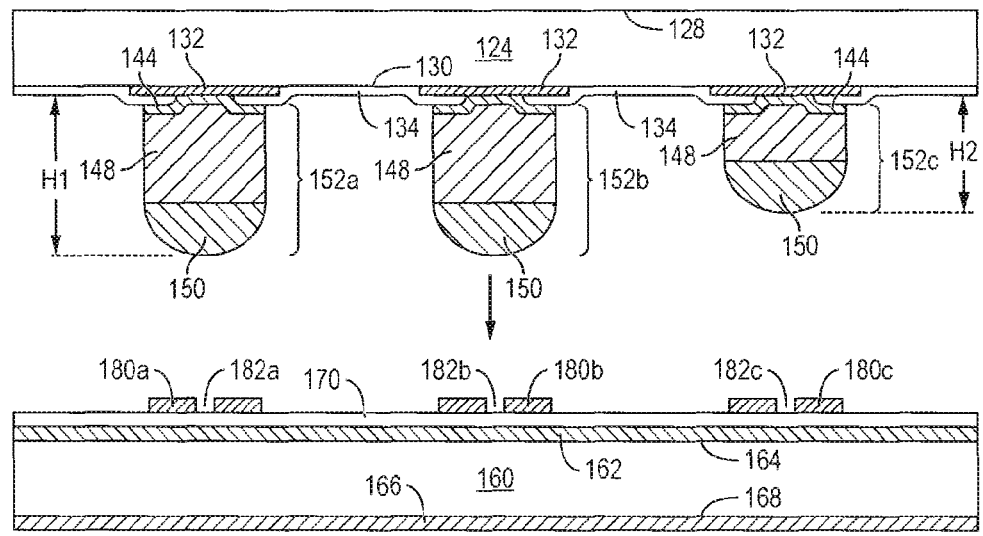
FIGS. 5a-5d illustrate the semiconductor die mounted to the substrate with electrical interconnect continuity detection.

In FIG. 5a, semiconductor die 124 from FIGS. 3a-3h is positioned over and mounted to substrate 160 using a pick and place operation with active surface 130 oriented toward the substrate and composite interconnect structures 152a-152c aligned with conductive layer 180a-180c and channels 182a-182c over interconnect sites 184. In particular, composite interconnect structures 152 are aligned so that channels 182 extend on both sides, or at least one side, beyond a footprint of the composite interconnect structures. In the present example, composite interconnect structures 152a-152b have a height H1 and composite interconnect structure 152c has a height H2 that is less than H1 due to manufacturing deviation.

Figure 5B:
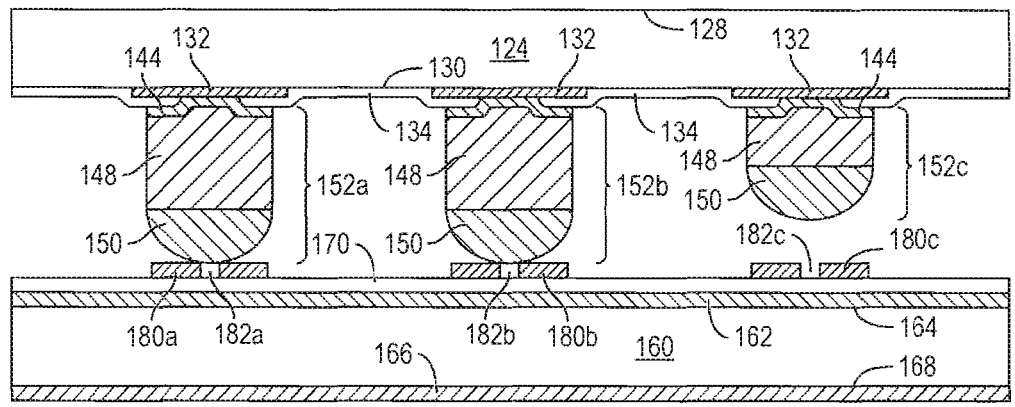

In FIG. 5b, bump caps 150 of composite interconnect structure 152a-152b make initial contact with conductive layer 180a-180b. Due to the lesser height H2, bump cap 150 of composite interconnect structure 152c does not make contact with conductive layer 180c. Prior to pressing bumps caps 150 onto conductive layer 180, the temperature of bump caps 150 of composite interconnect structures 152a-152c is elevated to melt the bump material. The melted bump caps 150 of composite interconnect structures 152a-152b are pressed onto conductive layer 180a-180b. Due to the lesser height H2, bump cap 150 of composite interconnect structure 152c fails to be pressed onto conductive layer 180c.

Figure 5C:
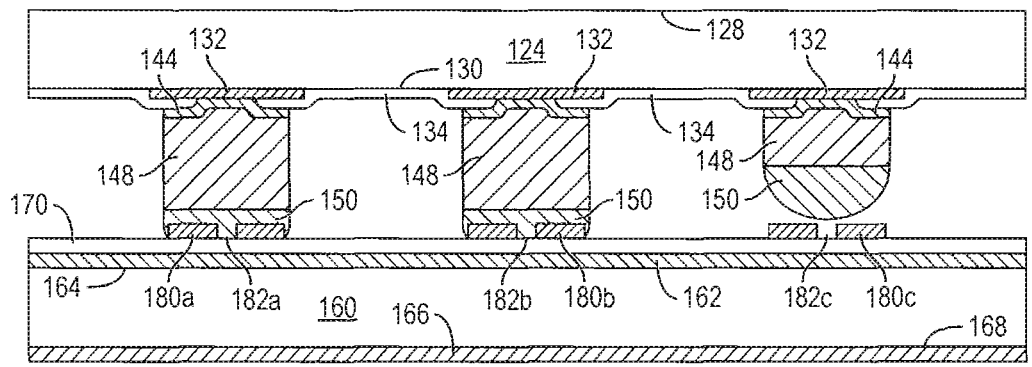

FIG. 5c shows semiconductor die 124 mounted to substrate 160 with composite interconnect structures 152a-152b electrically and metallurgically connected to conductive layer 180a-180b. Composite interconnect structures 152a-152b have a width greater than a width of conductive layer 180 so that bump cap 150 covers the upper surface and sides surfaces of conductive layer 180a-180b in a bump-on-lead configuration, while avoiding electrical contact with adjacent conductive layer 180. Channels 182a-182c extend on both sides, or at least one side, beyond a footprint of composite interconnect structures 152a-152c. In one embodiment, channels 182 are exposed on each side of the footprint of composite interconnect structures 152a-152c by a distance of about ⅓ the length of channel 182.

While in a melted state, bump caps 150 of composite interconnect structures 152a-152b are pressed onto and around conductive layer 180a-180b. The melted bump material of bump caps 150 of composite interconnect structures 152a-152b also flows into channels 182a-182b. Due to the lesser height H2, bump cap 150 of composite interconnect structure 152c is not pressed onto conductive layer 180c and the melted bump material does not flow into channel 182c.

Conductive layer 180 with channels 182 also provides greater contact surface between bump cap 150 and conductive layer 180. Given that conductive layer 180 has a width of 40 µm and thickness of 30 µm and the width of channel 182 is 10 µm leaving 15 µm of conductive layer 180 on either side of the channel. The contact surface between bump cap 150 and conductive layer 180 is 30+15+30+30+15+30=150 µm.

Figure 5D:
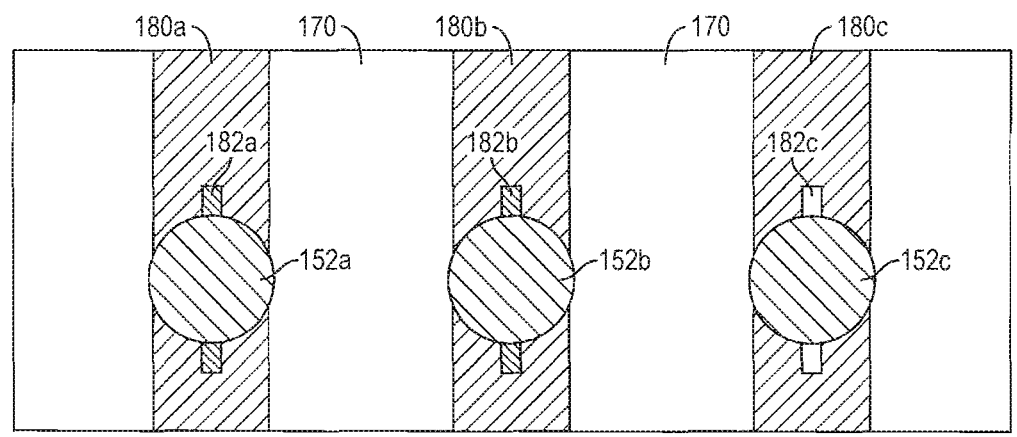

FIG. 5d shows a plan view of composite interconnect structures 152a-152b electrically and metallurgically connected to conductive layer 180a-180b. Bump material from bump caps 150 of composite interconnect structures 152a-152b has dispersed into channels 182a-182b as the melted bump caps are pressed onto and around conductive layer 180a-180b. Due to the lesser height H2, bump cap 150 of composite interconnect structure 152c is not pressed onto conductive layer 180c and the melted bump material does not flow into channel 182c.

Accordingly, conductive layer 180 with channels 182 provides continuity confirmation or inspection and fault detection for electrical interconnects between semiconductor die 124 and substrate 160. The presence of bump material in channels 182a-182b indicates electrical continuity and a reliable interconnect union between composite interconnect structures 152a-152b and conductive layer 180a-180b. Bump cap 150 has been pressed over conductive layer 180a-180b to a sufficient depth that a portion of the melted bump material flows into channels 182a-182b. In the case of composite interconnect structure 152c, the lesser height H2 causes the corresponding bump cap 150 to fail to make metallurgical connection to conductive layer 180c. The melted bump material from bump cap 150 of composite interconnect structure 152c does not flow into channel 182c. The absence of bump material in channel 182c indicates no electrical continuity, no interconnect union, or less than reliable interconnect union between composite interconnect structure 152c and conductive layer 180c. Since channels 182a-182c extend beyond a footprint of composite interconnect structures 152a-15c, the presence or absence of bump material in channels 182a-182c can be readily detected or observable by X-ray or visual inspection. In addition, conductive layer 180 with channels 182 increases the contact surface between bump cap 150 and conductive layer 180.

In summary, semiconductor die 124 has a plurality of composite bump structures 152 formed over a surface of the semiconductor die. Conductive layer 180 is formed over substrate 160 with channel 182 in interconnect site 184 of the conductive layer. Conductive layer 180 with channel 182 is made by forming a patterning layer 172 over substrate 160, forming a plurality of openings 174 in patterning layer 172, depositing a conductive material in openings 174, and removing a remainder of patterning layer 172 to form conductive layer 180 with channel 182 in interconnect site 184 of the conductive layer. The openings 174 can be formed by LDA. Channel 182 extends beyond a footprint of composite bump structures 152. Semiconductor die 124 is disposed over substrate 160. The bump material of composite bump structures 152 is melted. Composite bump structures 152 is pressed over interconnect site 184 of conductive layer 180 so that the melted bump material flows into channel 182. A width of composite bump structure 152 is greater than a width of conductive layer 180. Electrical continuity and reliable interconnect union between composite bump structures 152 and conductive layer 180 is detected or observable by a presence of the bump material in channel 182. No electrical continuity or a less than reliable interconnect union between composite bump structures 152 and conductive layer 180 is detected or observable by an absence of the bump material in channel 182. The electrical continuity or no electrical continuity between composite bump structures 152 and conductive layer 180 is detected or observable by X-ray or visual inspection.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a flip-chip semiconductor die including a first bump which comprises a first conductive pillar and a first conductive cap formed on a surface of the flip-chip semiconductor die;
    providing a substrate;
    forming an insulating layer over the substrate;
    forming a first conductive trace over the insulating layer, wherein a length of the first conductive trace is greater than a width of the first conductive trace and the first conductive trace includes a first open channel formed within an interior region of the first conductive trace, wherein the first open channel extends along a portion of the length of the first conductive trace under the first bump and in opposing directions beyond a footprint of the first bump to terminate within the interior region of the first conductive trace and further extends in-depth to the insulating layer;
    bonding the flip-chip semiconductor die to the substrate by bringing the first conductive cap in contact with the first conductive trace and reflowing the first conductive cap, wherein a portion of the first conductive cap flows into the first open channel; and
    detecting electrical continuity between the first bump and the first conductive trace by a detectable presence of the portion of the first conductive cap in portions of the first open channel of the first conductive trace which extend in opposing directions beyond the footprint of the first bump.

2. The method of claim 1, wherein a height of the conductive pillar is greater than a height of the conductive cap.

3. The method of claim 1, further including:
    providing a second bump which comprises a second conductive pillar and a second conductive cap formed on the surface of the flip-chip semiconductor die;
    forming a second conductive trace over the insulating layer, wherein a length of the second conductive trace is greater than a width of the second conductive trace and the second conductive trace includes a second open channel formed within an interior region of the second conductive trace, wherein the second open channel extends along a portion of the length of the second conductive trace under the second bump and in opposing directions beyond a footprint of the second bump to terminate within the interior region of the second conductive trace and further extends in-depth to the insulating layer; and
    detecting no electrical continuity between the second bump and the second conductive trace by a detectable absence of a portion of the second conductive cap in portions of the second open channel of the second conductive trace which extend in opposing directions beyond the footprint of the second bump.

4. The method of claim 3, wherein the first open channel along the portion of the length of the first conductive trace is offset with respect to the second open channel along the portion of the length of the second conductive trace.

5. The method of claim 3, further including detecting the electrical continuity between the first bump and the first conductive trace or no electrical continuity between the second bump and the second conductive trace by visual inspection.

6. The method of claim 1, further including forming the first conductive trace by evaporation, sputtering, electrolytic plating, electroless plating, or screen printing.

7. A method of making a semiconductor device, comprising:
    providing a semiconductor die including a first bump formed on a surface of the semiconductor die;
    providing a substrate;
    forming a first conductive trace over the substrate, wherein a length of the first conductive trace is greater than a width of the first conductive trace and the first conductive trace includes a first open channel formed within an interior region of the first conductive trace, wherein the first open channel extends along a portion of the length of the first conductive trace under the first bump and in opposing directions beyond a footprint of the first bump to terminate within the interior region of the first conductive trace;
    disposing the semiconductor die in contact with the substrate and the first bump aligned with the first conductive trace over the first open channel;
    reflowing the first bump, wherein the first bump fails to flow into the first open channel; and
    detecting no electrical continuity between the first bump and the first conductive trace by a detectable absence of a portion of the first bump in portions of the first open channel of the first conductive trace which extend in opposing directions beyond the footprint of the first bump.

8. The method of claim 7, wherein a length of the first open channel is greater than a width of the first open channel.

9. The method of claim 7, further including:
    providing a second bump formed on the surface of the semiconductor die;
    forming a second conductive trace over the substrate, wherein a length of the second conductive trace is greater than a width of the second conductive trace and the second conductive trace includes a second open channel formed within an interior region of the second conductive trace, wherein the second open channel extends along a portion of the length of the second conductive trace under the second bump and in opposing directions beyond a footprint of the second bump to terminate within the interior region of the second conductive trace; and
    detecting electrical continuity between the second bump and the second conductive trace by a detectable presence of a portion of the second bump in portions of the second open channel of the second conductive trace which extend in opposing directions beyond the footprint of the second bump.

10. The method of claim 9, wherein the first open channel along the portion of the length of the first conductive trace is offset with respect to the second open channel along the portion of the length of the second conductive trace.

11. The method of claim 9, wherein the second bump contacts a major surface of the second conductive trace and a side surface of the second conductive trace within the second open channel.

12. The method of claim 7, wherein a width of the first bump is greater than a width of the first conductive trace.

13. The method of claim 7, wherein the semiconductor die is a flip-chip semiconductor die.

14. A method of making a semiconductor device, comprising:
providing a semiconductor die including a first interconnect structure formed on a surface of the semiconductor die;
providing a substrate;
forming a first conductive trace over the substrate, wherein the first conductive trace includes a first open channel formed within an interior region of the first conductive trace, wherein the first open channel extends along a length of the first conductive trace under the first interconnect structure and in opposing directions beyond a footprint of the first interconnect structure to terminate within the interior region of the first conductive trace;
disposing the semiconductor die in contact with the substrate and the first interconnect structure aligned with the first conductive trace over the first open channel;
reflowing the first interconnect structure, wherein the first interconnect structure fails to flow into the first open channel; and
detecting no electrical continuity between the first interconnect structure and the first conductive trace by a detectable absence of a portion of the first interconnect structure in the first open channel of the first conductive trace which extend in opposing directions beyond the footprint of the first interconnect structure.

15. The method of claim 14, wherein a length of the first open channel is greater than a width of the first open channel.

16. The method of claim 14, further including:
providing a second interconnect structure formed on the surface of the semiconductor die;
forming a second conductive trace over the substrate, wherein the second conductive trace includes a second open channel formed within an interior region of the second conductive trace, wherein the second open channel extends along a length of the second conductive trace under the second interconnect structure and in opposing directions beyond a footprint of the second interconnect structure; and
detecting electrical continuity between the second interconnect structure and the second conductive trace by a detectable presence of a portion of the second interconnect structure in the second open channel of the second conductive trace which extend in opposing directions beyond the footprint of the second interconnect structure.

17. The method of claim 16, wherein the first open channel along a length of the first conductive trace is offset with respect to the second open channel along a length of the second conductive trace.

18. The method of claim 16, wherein the second interconnect structure contacts a major surface of the second conductive trace and a side surface of the second conductive trace within the second open channel.

19. The method of claim 14, wherein a width of the first interconnect structure is greater than a width of the first conductive trace.

20. A method of making a semiconductor device, comprising:
providing a semiconductor die including a plurality of interconnect structures formed on a surface of the semiconductor die;
providing a substrate;
forming a plurality of conductive traces over the substrate, wherein the conductive traces each include an open channel formed within an interior region of the conductive traces, wherein the open channel extends along a length of the conductive traces under the interconnect structures and in opposing directions beyond a footprint of the first interconnect structures to terminate within the interior region of the conductive traces;
disposing the semiconductor die over the substrate with the interconnect structures aligned to the conductive traces over the open channel;
mounting the semiconductor die over the substrate to make a connection between the interconnect structures and the conductive traces over the open channel; and
detecting a state of connection between the interconnect structures and the conductive traces by whether a portion of the interconnect structures is found in the open channel which extend beyond the footprint of the interconnect structures.

21. The method of claim 20, wherein a length of the open channel is greater than a width of the open channel.

22. The method of claim 20, wherein the open channel along a length of a first one of the conductive traces is offset with respect to the open channel along a length of a second one of the conductive traces.

23. The method of claim 20, wherein the interconnect structures contact a major surface of the conductive traces and a side surface of the conductive traces within the open channel.

24. The method of claim 20, wherein a width of the interconnect structures is greater than a width of the conductive traces.

* * * * *